(12) United States Patent
Marion

(10) Patent No.: US 8,097,827 B2
(45) Date of Patent: Jan. 17, 2012

(54) METHOD FOR SOLDERING TWO ELEMENTS TOGETHER USING A SOLDER MATERIAL

(75) Inventor: Francois Marion, Saint Martin le Vinoux (FR)

(73) Assignee: Commissariat a l'Energie Atomique, Paris (FR)

( * ) Notice: Subject to any disclaimer, the term of this patent is extended or adjusted under 35 U.S.C. 154(b) by 966 days.

(21) Appl. No.: 12/055,716

(22) Filed: Mar. 26, 2008

(65) Prior Publication Data

US 2009/0145885 A1  Jun. 11, 2009

(30) Foreign Application Priority Data

Mar. 26, 2007 (FR) ...................... 07 54026

(51) Int. Cl.
*B23K 11/00* (2006.01)
(52) U.S. Cl. .................................. 219/117.1
(58) Field of Classification Search .......... 250/20.1; 257/88, 446, 443, 444; 228/56.3, 180.2, 228/180.22, 193, 197, 195, 245, 254, 256; 361/414, 403, 417; 219/117.1, 85.1–85.22; 29/840, 830, 832, 829, 739, 741, 841, 842, 29/25.01
See application file for complete search history.

(56) References Cited

U.S. PATENT DOCUMENTS 3,871,015 A * 3/1975 Lin et al. .............. 257/779
4,017,889 A   4/1977 Miller
4,332,343 A * 6/1982 Koopman et al. ........ 228/231
4,592,944 A   6/1986 Clark et al.
2005/0161493 A1* 7/2005 Ference et al. ........ 228/180.22
2006/0030075 A1* 2/2006 Sugiyama et al. ......... 438/108

FOREIGN PATENT DOCUMENTS

FR   2890235   3/2007

OTHER PUBLICATIONS

The International Search Report FR/0754026 Dated Nov. 20, 2007.

* cited by examiner

*Primary Examiner* — Tu B Hoang
*Assistant Examiner* — Thien Tran
(74) *Attorney, Agent, or Firm* — Burr & Brown

(57) ABSTRACT

A method for soldering or hybridizing two components including preparing, on opposing surfaces of the components to be welded or hybridized, a wettability surface, depositing on one of the wettability surfaces an appropriate quantity of solder material, constituting a soldering or hybridizing dot, contacting the wettability surfaces of the components with the solder material deposited, then raising the temperature of the chamber in which the components are positioned, to at least the melting point of the solder material in order to ensure the effective soldering or hybridizing of the two components together by a remelt effect. At least one of the components is in contact with a conducting track having another quantity of solder material that constitutes a sacrificial dot, having a contact area with the at least one component that is higher than that of the solder quantity that constitutes the soldering or hybridizing dot.

6 Claims, 2 Drawing Sheets

METHOD FOR SOLDERING TWO ELEMENTS TOGETHER USING A SOLDER MATERIAL

TECHNICAL FIELD OF THE INVENTION

The present invention relates to the field of microelectronics and, more particularly, that of techniques of hybridization by beads of heterogeneous components, also called solder beads. It is therefore related to the general field of microcomponents, more conventionally called electronic chips, but is also suitable for application to micro-sensors, micro-actuators, such as micro-electromechanical systems (MEMS) and also optoelectronic components, of the Vertical Cavity Semiconductor Emitting Laser (VCSEL) type, etc.

In the context of the present invention, components means an electronic sensor, such as an electronic chip, an electrical or electronic circuit support, or even a passive mechanical component of the protective cover type, or even a sensor of a physical quantity.

PRIOR ART

The microcomponents referred to in the present invention are conventionally deposited on a substrate of an appropriate type, for example of the semiconductor type (silicon single-crystal, sapphire, etc.) for electronic components.

These substrates are provided with electricity conducting tracks, for example prepared from aluminum, which radiate from the microcomponent toward the periphery of the substrate, in order to permit, besides the electric power supply of the component, required if necessary, also and above all, the processing and use of the signals that said component is designed to generate, and even the control of the function that it incorporates.

To assemble various components together, one of the techniques widely used today is that of the hybridization by beads called "Flip Chip". This technology briefly consists in:
  depositing on one or more wettable surfaces positioned on one of the components for assembling the constituent material of the solder beads, an appropriate quantity of said fusible material;
  then providing the other component to be hybridized with surfaces wettable by said fusible material, said surfaces being arranged substantially above the surfaces of said first component when the second component is transferred to the first;
  then, by raising the temperature to a temperature above the melting point of the constituent material of the beads, in obtaining the melting thereof until the desired result is obtained, that is the hybridization of the first component on the second component, said beads creating a mechanical and/or electrical bond between the wettable surfaces of each of the components, at least one of said wettable surfaces being itself connected electrically to the conducting tracks arranged thereon.

Thus, during the assembly process, the solder material constituting the beads adopts the form of a bead.

In fact, the soldering of indium to a wettable surface, typically made from gold, requires the use of liquid or gaseous deoxidizing agents, also called soldering flux. This flux allows deoxidation of the native oxides present on the surface of the beads before soldering.

These soldering fluxes are inherently generally corrosive, and after reduction of the oxide, are liable also to attack the core of the weld metal.

In fact, experience demonstrates that this undesirable corrosion is aggravated by two particular configurations:
  a cell effect resulting from the use of pairs of metals having different electrochemical potentials in the presence of the soldering flux, the latter acting as an electrolyte;
  the excessively long contact time between the solder beads and the flux.

The cell effect can be explained as follows, in relation to FIGS. 1 and 2, which schematically describe a Flip Chip hybridization according to the prior art.

These figures show a first component 1 on which a chip 2 is hybridized.

The component 1 comprises a host substrate 3, typically made from silicon, on which conducting tracks 4 are prepared, for example made from aluminum. Above the hybridization zones, wettable surfaces 7 and 8 are prepared respectively on the substrate 3 and on the chip to be hybridized 2, also called Under Bump Metallization (UBM) and typically made from gold.

Simultaneously, the component 1 also comprises a plurality of outer connection dots 5, also called thermocompression dots. These dots consist in fact of an electrically conducting surface, suitable for providing a relay for connection between the hybridized component and the exterior. Such a dot is conventionally a metal surface on which a conducting wire, typically made from gold, is thermocompressed.

During the hybridization, a deoxidizer 9 (FIG. 2) is spread on the entire component 1 after deposition of the solder or weld material designed to constitute the hybridization bead 6, automatically covering both the outer connection dot 5 and the hybridization bead 6. The material constituting said bead is usually made from indium, tin/lead alloy, or leadless alloy like AgCuSn.

Thus, the gold layer of the outer connection dot 5 is connected by an electrical connection consisting of the aluminum track 4 to the weld bead 6, so that due to the presence of the soldering flux, which acts as an electrolyte, a closed electrical circuit is created, generating an electrochemical mechanism culminating in the reduction of the material constituting the hybridization bead, according to the well known principles of electrochemical cells, due to the different electrochemical potentials of the metals employed.

In doing so, the reduction of the material constituting the bead is observed, culminating in its at least partial dissolution in the soldering flux, and in consequence, in the alteration of the desired hybridization between the chip 2 and the component 1.

In order to overcome this drawback, it was first proposed either to cover the outer connection dots with an insulating layer in order to isolate the electrochemical circuit previously described, or to replace the gold of the outer connection dot by a metal having the same electrochemical potential as the material constituting the bead. However, these two solutions complicate the method for fabricating the host circuits, in this case the component, if only because of the addition of a supplementary step culminating, in addition to a loss in terms of manufacturing yield, an extra manufacturing cost.

It has also been proposed to employ cathodic protection:
  either by deposition of a sacrificial anode, and based on the principle of bimetallic corrosion; one metal is connected to the metal to be protected, this added metal being corroded instead of the metal structure,
  or by the method called current bleeding, which requires the use of a DC electric power supply. The structure to be protected is connected in this case to the negative terminal of a DC generator regulated in order to maintain the structure to be protected in its immunity zone.

In either case, the cathodic protection complicates the fabrication process, and in the latter case, also the management of the signal inputs and outputs.

However, it must be emphasized that this technical problem inherent in the electrochemical consumption of the material constituting the hybridization beads is not really critical if the hybridization as such can be carried out in a shorter time.

However, said hybridization conditions tend to become systematically collective in order to reduce the fabrication costs. Thus, hybridization is carried out by the technique of collective remelting of the components deposited in hundreds, or even in thousands, on a host substrate. The corresponding hybridization sequences may therefore last several hours and, in this eventuality, can no longer accommodate the mechanisms of corrosion or electrochemical consumption previously described, which are then augmented with the time factor.

It is the object of the present invention to overcome this dual technical problem without necessarily complicating the hybridization process.

SUMMARY OF THE INVENTION

The invention therefore relates to a method for soldering or hybridizing two components together using a solder material, at least one of said components, called first component, comprising one or more electrically conducting metal tracks, connected to as many outer connection dots, consisting in:
preparing, on the opposing surfaces of the components to be welded or hybridized, a wettability surface, said surface prepared on said first component being in electrical contact with a conducting metal track;
depositing on one of said wettability surfaces an appropriate quantity of solder material, suitable for constituting a soldering or hybridization dot;
contacting the wettability surface of the other component with the solder material thereby deposited;
then raising the temperature of the chamber in which the components to be welded or hybridized are positioned, to at least the melting point of the solder material in order to ensure the effective soldering or hybridizing of the two components together by a remelt effect.

According to the invention, this method further consists in depositing on said first component and in contact with said conducting track, another quantity of said solder material, constituting a sacrificial dot, having a contact area with said first component that is higher than that of said first quantity intended to constitute the soldering or hybridizing dot.

In other words, the invention consists in introducing, between the outer connection dot and the solder dot or solder bead, one or a plurality of sacrificial dots, suitable for accumulating the corrosion while sparing the solder dot called "useful" from being corroded. Accordingly, it is the sacrificial dots which are reduced during the hybridization operation due to the use of a soldering flux, instead of the material constituting the solder dots or solder beads.

Advantageously, a higher electrical resistance is induced between said sacrificial dot and the outer connection dot than between the sacrificial dot and the soldering or hybridizing dot.

In a preferred embodiment, the invention serves to virtually reduce to zero the potential difference between the sacrificial dots and the useful solder beads, so that no electrochemical mechanism is liable to occur at said beads, in the absence of virtual absence of electrical current flow therein during the hybridization operation.

According to an advantageous feature of the invention, the area of the sacrificial dot in contact with said first component is at least ten percent (10%) higher than that of the solder dot or bead before hybridization.

According to another feature of the invention, and in the configuration whereby the sacrificial dots are fully or partly located under the chip to be hybridized, the height of said dots is lower than that of the useful solder dot.

According to a further feature of the invention, and in the configuration whereby the sacrificial dots are fully or partly located under the chip to be hybridized, said dots come into contact with the underside of the chip to be hybridized, at a connection dot called "dead" dot, unconnected to the active circuit of the chip.

It is accordingly clear that the implementation of such a sacrificial dot does not demand an additional level of technology compared with conventional technologies, insofar as the deposition of this sacrificial dot occurs simultaneously with the deposition of the quantity of material designed to act as a useful solder bead.

BRIEF DESCRIPTION OF THE DRAWINGS

The manner in which the invention can be implemented and the advantages thereof will appear better from the exemplary embodiments that follow, provided for information and nonlimiting, in conjunction with the appended figures.

DETAILED DESCRIPTION OF THE EMBODIMENTS OF THE INVENTION

Figure 1:
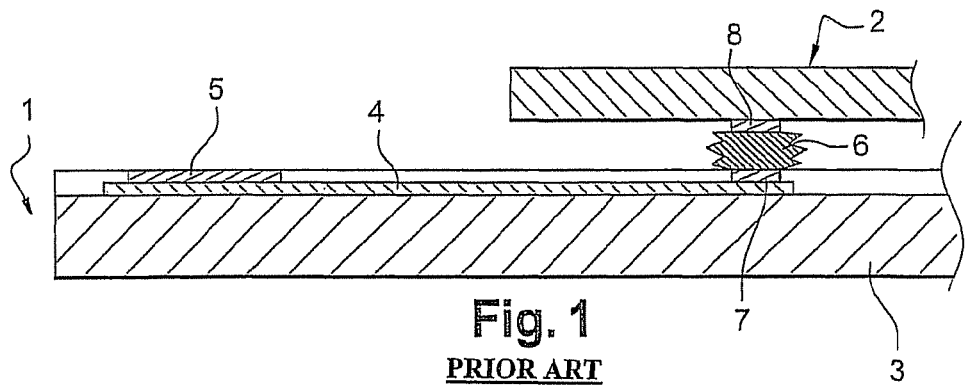
FIGS. 1 and 2 are, as already stated, schematic representations of the hybridization principle according to the prior art.
Figure 2:
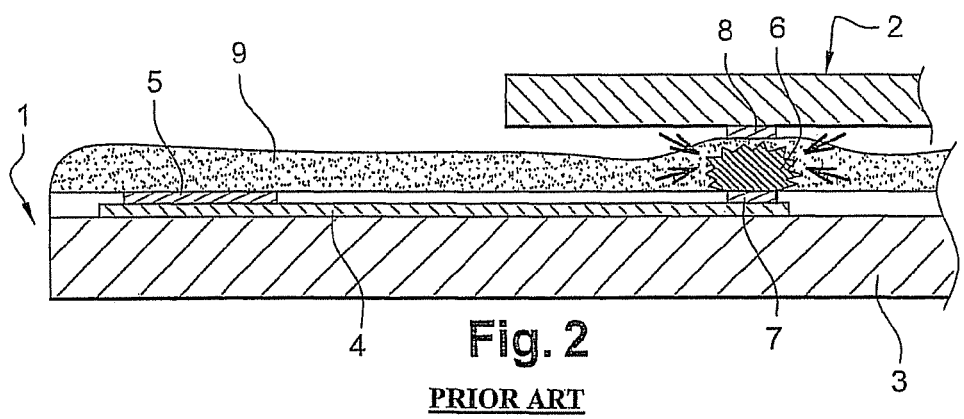
Figure 3:
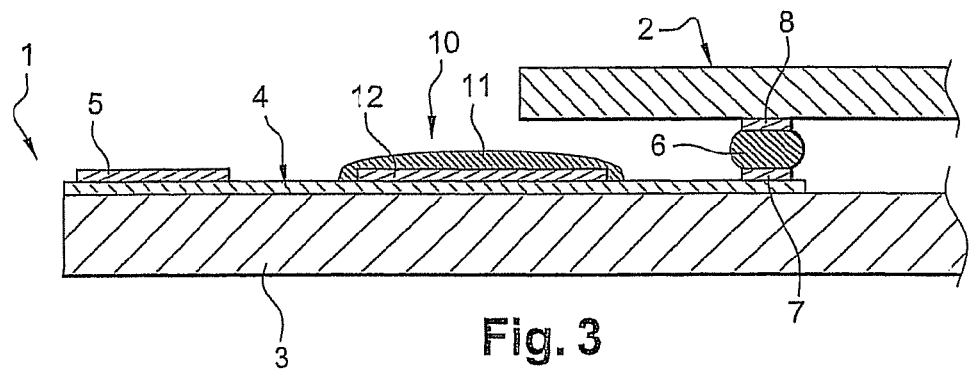
FIGS. 3 and 4 are schematic representations in a cross section and a plan view respectively of the principle underlying the present invention.
Figure 4:
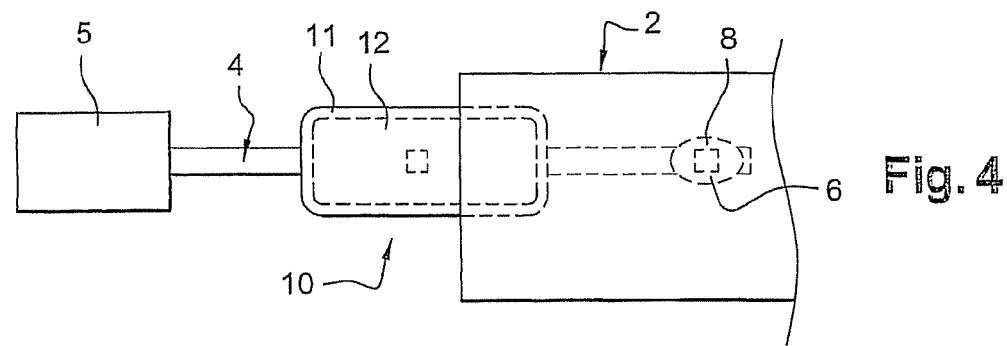

The invention will therefore be described more particularly in its principle related to FIGS. 3 and 4.

These figures show the hybridization of an electronic chip 2 on an electronic component 1. The latter, as already stated, basically comprises a substrate 3 also called host substrate, typically made from a semiconductor material, and particularly of silicon single-crystal. On this substrate 3, a number of electrically conducting tracks 4 are arranged, designed in the present case to permit the transmission of electrical signals issuing from the chip 2 to the exterior for their processing. Accordingly, these electrical tracks 4, for example made from aluminum, culminate in one or more outer connection dots.

Conventionally, the preparation of such outer connection dots implies the use of a localized layer promoting the electrical conduction and in the present case, consisting of a gold wire 5.

Concerning the actual hybridization, the connection beads also called useful beads are typically made by the deposition of a quantity of solder material 6, and particularly of indium, on a wettability zone 7, also made from gold, and positioned in contact with the conducting track 4 at the place selected for hybridization. The chip 2 also comprises such a wettability zone 8, located substantially above the wettability zone 7 for reasons of alignment of said chip on the electronic component 1.

According to an essential feature of the invention, a first objective is achieved by depositing, between the outer connection dot 5 and the first useful bead 6, a quantity of solder material 11, of the same type as that constituting said useful bead 6 on a wettability surface 12 also added on or deposited on the conducting track 4. A dot is thereby prepared qualified as sacrificial 10, owing to its partial disappearance during the actual hybridization operation.

The formation of this sacrificial dot 10 occurs at the same time as the formation of the solder bead 6.

The area occupied by the sacrificial dot 10 on the host substrate 3 is at least ten percent higher than that occupied by the deposit of solder material constituting the useful hybridization bead 6. This difference in area can clearly be observed for example in FIG. 4, which shows a plan view of the general principle underlying the present invention.

A second objective resides in the formation of an electrical resistance between the outer connection dot 5 and the sacrificial dot 10 that is greater than that existing between said sacrificial dot 10 and the hybridization bead 6 when the whole is coated with the soldering flux.

A potential difference is then created between the sacrificial dot 10 and the outer connection dot 5 that is greater than the potential difference between said sacrificial dot 10 and the bead 6. The current flowing in these connections is then lower, causing less electrochemical corrosion both of the sacrificial dot and of the "useful" bead, which serves in particular to improve the service life of the component.

Thus, during the spreading of the soldering flux in addition to the ramp up of the melting and soldering temperature, which was previously declared to be liable to last several hours for multiple hybridizations, only, or virtually only the material 11 constituting the sacrificial dot 10 is liable to be reduced owing to the cell effect and diluted in the soldering flux. In other words, the useful hybridization bead 6 is no longer consumed during this operation.

In the particular case it may be necessitated by construction, in which the chip to be hybridized 2 is relatively close to the outer connection dot 5, the material 11 constituting the sacrificial dot 10 is deposited so as to present a height lower than that of the deposit of solder material designed to constitute the hybridization bead 6.

Figure 5:
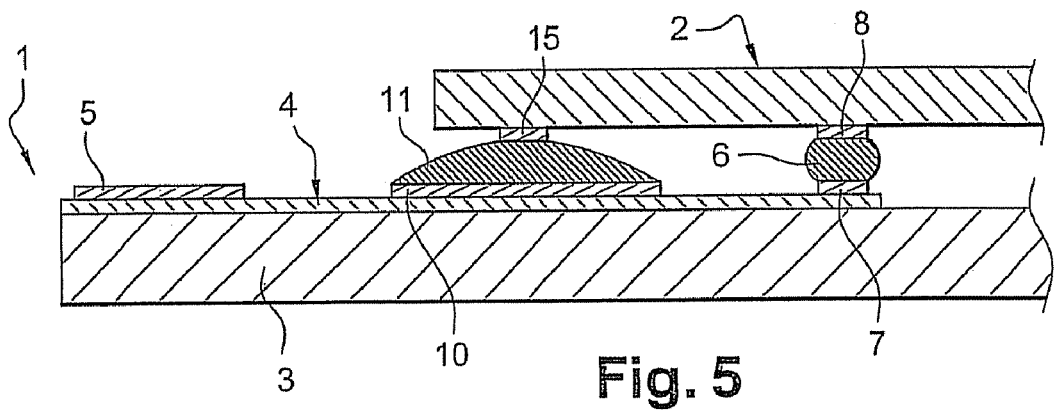
FIG. 5 is a schematic representation of an alternative of the invention.

In the same particular case, the implementation shown in FIG. 5 may be preferred. According to this embodiment, the sacrificial dot 10 comes into contact with the underside of the chip to be hybridized 2, at a dot 15, qualified as "dead" dot, that is unconnected to the active circuit of said chip, contrary to the dot 8, which is effectively connected to said active circuit.

It is clear that the hybridization process does not cause any further complication compared to that of the prior art and particularly does not imply the deposition of an additional level of any layer because, as already recalled, the deposition of the material designed to constitute the sacrificial dot 10 is carried out simultaneously with the deposition of the same solder material designed to constitute the useful hybridization beads 6. As a corollary, the alignment of the components facing each other, particularly flipped over and in the present case, of the chip 2, occurs in an absolutely conventional manner in the context of the Flip Chip technology.

During the temperature ramp-up phase designed to culminate in the melting of the beads, only the corrosion of the sacrificial dot 10 is activated, but on the other hand, the useful hybridization beads 6 are not affected. The useful beads are soldered to the opposite metalized dot 8 of the component to be hybridized, and in the present case of the chip 2, so that all the components deposited are simultaneously soldered.

During the cooling step, the host substrate 3 is cooled, and the soldering flux waste is cleaned. In doing so, the corrosion or consumption of the sacrificial dots stops because the electrochemical mechanisms disappear owing to the removal of the flux.

Figure 6:
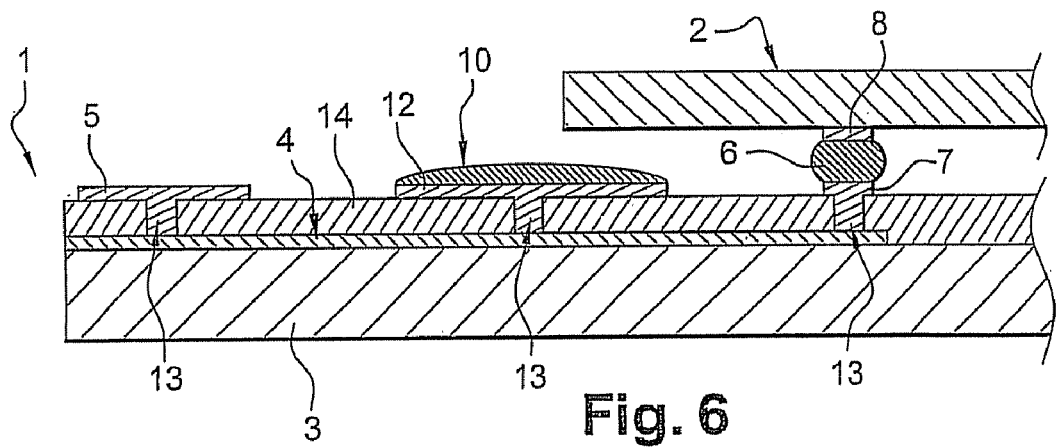
FIGS. 6 and 7 are schematic representations in a cross section and plan view respectively of another embodiment of the invention, implementing the semiconductor technology with vias.
Figure 7:
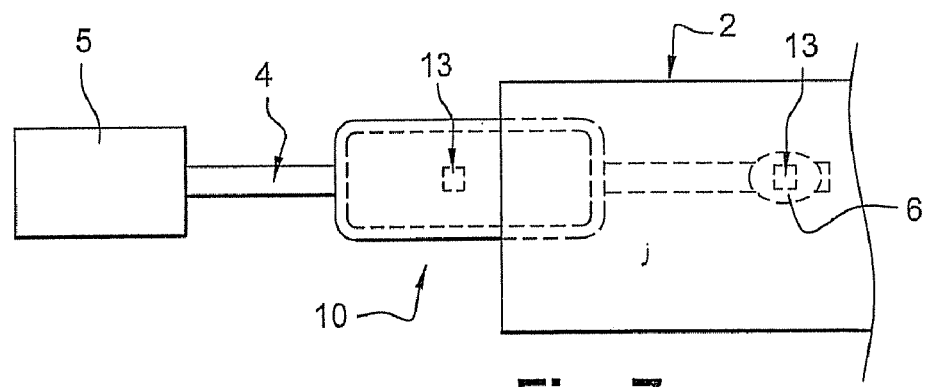

In a number of configurations, the connection lines of the semiconductor substrate 3 are passivated by a passivation layer 14, typically made from silica or silicon nitride. Openings 13, also called vias, are made in this layer, filled by an electrically conducting material, in order to electrically connect the wetting surfaces 7, 12 and the outer connection dot 5 to the connection tracks 4 (FIGS. 6 and 7). However, the inventive method remains strictly identical. Here also, a sacrificial dot 10 is used by the same operating procedure as that described in relation to FIGS. 3 to 5.

In the context of numerical application, and according to the following assumptions, the following data are for example obtained:

| | |
|---|---|
| Type of connection metal (conducting track 4) | aluminum |
| Type of welding or solder material | indium |
| Type of wettability surfaces | gold |
| Type of thermo compression dot | gold |
| Optionally passivation layer | silica or silicon nitride |

In a first example, the contact time of the soldering flux is set at two hours, due to the relatively smaller number of hybridized components.

| | |
|---|---|
| outer connection dot 5 (thermo compression) | 80 × 100 µm; |
| dimensions of the connection track 4 between sacrificial dot 10 and thermo compression dot 5 | length 20 µm, width 50 µm |
| dimensions of connection track 4 between sacrificial dot 10 and useful solder bead 6 | length 50 µm, width 10 µm |
| useful solder bead 6 | diameter 30 µm, height 20 µm |
| dimensions of sacrificial dot 10 | 50 × 50 µm for a thickness of 5 µm. |

When the flux contact time reaches higher values at typically eight hours, required in case of multiple hybridizations, the size of the sacrificial dot is accordingly increased in the same configuration to typically 100 µm×100 µm.

In doing so, by the implementation of the method according to the invention, a hybridization quality far superior to that of the prior art is obtained without complicating the conventional Flip Chip hybridization processes, because the hybridization beads employed are no longer or virtually no longer affected by the electrochemical mechanisms described in the introduction. It also becomes possible to further increase the number of components to be hybridized without any risk of deterioration of the hybridization.

The present invention therefore naturally finds its application in the hybridization fields conventionally employed such as in particular:
- transfer of the "multi-chip module" type on a silicon wafer, on a ceramic printed circuit;
- collective Flip Chip transfer of detection circuits, such as in particular infrared, visible X-ray, on a CMOS pad;
- collective Flip Chip transfer of optical, laser emission or reception circuits on CMOS pad or optical wafers of silicon or other material.

The invention claimed is:

1. A method for soldering or hybridizing first and second components together using a solder material, wherein at least the first component comprises one or more electrically conducting metal tracks, connected to an equal number of outer connection dots, said method comprising:

preparing, on each opposing surface of the components to be welded or hybridized, a wettability surface, said surface prepared on said first component being in electrical contact with said conducting metal track;

depositing on one of said wettability suffices an appropriate quantity of solder material, suitable for constituting an inner soldering or hybridization dot between the components;

depositing a soldering flux on the outer connection dots and the inner soldering or hybridization dots;

contacting the wettability surface of the second component with the solder material thereby deposited;

then raising a temperature of a chamber in which the components to be welded or hybridized are positioned, to at least a melting point of the solder material in order to ensure effective soldering or hybridizing of the two components together by a remelt effect, and depositing on said first component and in contact with said conducting metal track, another quantity of said solder material, constituting a sacrificial dot placed in series on said conducting metal track between the outer connection dot and the inner soldering or hybridization dot, said sacrificial dot having a contact area with said first component that is higher than that of said first quantity intended to constitute the inner soldering or hybridization dot.

2. The method for soldering or hybridizing two components together using a solder material, as claimed in claim 1, further comprising inducing a higher electrical resistance between the sacrificial dot and the outer connection dot than between the sacrificial dot and the inner soldering or hybridization dot.

3. The method for soldering or hybridizing two components together using a solder material, as claimed in claim 1, wherein the area of the sacrificial dot in contact with said first component is at least ten percent higher than that of the inner soldering or hybridization dot or before hybridization.

4. The method for soldering or hybridizing two components together using a solder material, as claimed in claim 1, wherein when by construction, said second component is relatively close to the outer connection dot, the sacrificial dot is fully or partly located under said second component, the height of said sacrificial dot being lower than that of the inner soldering or hybridization dot.

5. The method for soldering or hybridizing two components together using a solder material, as claimed in claim 1, wherein when by construction, said second component is relatively close in height to the outer connection dot, the sacrificial dot is fully or partly located under said second component and comes into contact with the underside of said second component, at a connection dot, unconnected to an active circuit of said second component.

6. The method for soldering or hybridizing two components together using a solder material, as claimed in claim 1, wherein the constituent material of the sacrificial dot is deposited on a wettable surface in electrical contact with said conducting metal track.

* * * * *